United States Patent [19]

Doemens

[11] Patent Number: 4,904,067
[45] Date of Patent: Feb. 27, 1990

[54] SELECTION DEVICE

[75] Inventor: Guenter Doemens, Holzkirchen, Fed. Rep. of Germany

[73] Assignee: Siemens Aktiengesellschaft, Berlin and Munich, Fed. Rep. of Germany

[21] Appl. No.: 168,986

[22] Filed: Mar. 16, 1988

[30] Foreign Application Priority Data

Mar. 31, 1987 [DE] Fed. Rep. of Germany ....... 3710597

[51] Int. Cl.⁴ .............................................. G02F 1/11
[52] U.S. Cl. .................................. 350/358; 250/578; 307/117
[58] Field of Search ................ 307/117, 311; 250/209, 250/213 A, 578; 350/358, 355, 356

[56] References Cited

U.S. PATENT DOCUMENTS

| | | | |
|---|---|---|---|
| 2,813,983 | 11/1957 | Hammar | 250/209 |
| 3,191,040 | 6/1965 | Critchlow | |
| 3,505,527 | 4/1970 | Slana | |
| 3,666,966 | 5/1972 | Buss | |
| 3,749,970 | 7/1973 | Schmersal | |
| 4,124,280 | 11/1978 | Berg et al. | 350/358 |
| 4,126,834 | 11/1978 | Coppock | 350/358 X |
| 4,455,485 | 6/1984 | Hosaka | 250/234 |
| 4,509,045 | 4/1985 | Lustig | 250/213 A X |
| 4,600,878 | 7/1986 | Doemens et al. | 324/514 |
| 4,639,092 | 1/1978 | Gottlieb | 350/358 X |
| 4,722,596 | 2/1988 | Labrum | 350/358 |

FOREIGN PATENT DOCUMENTS 0052892 6/1982 European Pat. Off. .
2547938 4/1977 Fed. Rep. of Germany .
2516325 5/1983 France .

OTHER PUBLICATIONS

IBM Technical Disclosure Bulletin entitled "Membrane Contact Array with Photosensitive Interconnections", vol. 14, No. 11, Apr. 1972.

Primary Examiner—Eugene R. LaRoche
Assistant Examiner—Nathan W. McCutcheon
Attorney, Agent, or Firm—Hill, Van Santen, Steadman & Simpson

[57] ABSTRACT

A selection device for reliable selection of a plurality of lines or of a plurality of contact locations. In order to select at least two of a plurality of lines, at least two selection lines are connected to every line via a photoresistor, whereby every photoresistor is preferably controllably chargeable with light via a deflectable beam. The selection occurs when selected photoresistors are changed to a low resistance state by light impingement. For selecting at least two of a plurality of contact locations arranged in a grid pattern, the contact locations are connected to the lines via photoresistors. The device of the present invention is preferably utilized for the electrical function testing of printed circuit boards.

13 Claims, 2 Drawing Sheets

SELECTION DEVICE

BACKGROUND OF THE INVENTION

The present invention is directed to a device for selecting at least two of a plurality of lines and to a device for selecting at least two of a plurality of contact locations arranged in a grid pattern.

In automatic testing units and adapters for printed circuit boards equipped with or without components as well as for wiring matrices in solder or crimp technology, the contacting of the selected measuring locations is usually undertaken via resilient test probes. The resilient test probes arranged according to the grid dimension of the wiring matrix to be tested are secured with spring sleeves that are pressed into a carrier plate and into which the test probes are inserted (Elektronic Produktion und Prueftechnik, November 1979, pages 472 and 473).

European Pat. application No. 0 102 565 discloses a device for the electrical function testing of wiring matrices wherein the ohmic contacting of the measuring locations is replaced by non-touching, ionic contacting via gas discharge paths. To this end, a plurality of gas discharge channels provided with electrodes are located in a carrier plate that can be placed onto the wiring matrices. Gas discharge channels located in a frame of the wiring matrices are open in the direction toward the measuring locations. When, two selected measuring locations are connected to one another in an electrically conductive fashion by an interconnect, then the associated gas discharge channels form two series-connected gas discharge paths that can be ignited by applying an adequately high voltage to the electrodes. A current flow that can be evaluated for testing purposes results with the ignition of the gas discharges. When the ignition of the gas discharges fails to occur or when too low a current flows after an ignition, it can be concluded that an interrupted electrically conductive connection exists between the selected measure locations or that an electrically conductive connection was not formed when the wiring matrix was constructed. When an alternating voltage is superimposed on the voltage applied to the electrodes, then the resulting current change can be measured phase-sensitive relative to the applied alternating voltage and can be utilized for identifying the resistance of a connection existing between the selected measuring locations. The known device thus provides conductivity and insulation measurements, whereby an extremely high reliability is achieved by avoiding ohmic contacts.

In automatic testing units and adapters for printed circuit boards equipped with or without components as well as for wiring matrices in solder or crimp technology, the plurality of measuring locations can amount to as many as a hundred thousand. In a device using resilient test probes as well as using ionic contacting via gas discharge paths, the plurality of required leads and switch elements increases with the plurality of measuring locations. Such an apparatus is very complex and results in high costs.

SUMMARY OF THE INVENTION

An object of the present invention is to provide a device with a minimum of components for selecting at least two of a plurality of lines or contact locations arranged in a grid pattern that has a reliable selection of a plurality of lines or contact locations.

In a means for selecting at least two of a plurality of lines, this object is inventively achieved in that at least two selection lines are connected to every line via a photoresistor and that every photoresistor can be charged with light in a controllable fashion.

In a device for selecting at least two of a plurality of contact locations arranged in a grid pattern the stated object is inventively achieved in that the contact locations are connected in rows to associated lines via associated photoresistor. At least two selected lines are connected to every line via a photoresistor. Every photoresistor can be charged with light in a controllable fashion.

The two solutions set forth above are based on the general, inventive concept that the selection of lines or contact locations can be considerably simplified by utilizing resistors that can be controllably charged with light. A type of "optical multiplexer" results having particular advantages attributable to a flexible light charging that is simple to implement. Thus, for example, two selection lines are sufficient to reliably select two contact locations from a plurality of contact locations.

According to a preferred development of the invention, the photoresistors are composed of cadmium sulfide or cadmium selenide. Photoresistors of these conductor materials provide a considerable increase in conductivity from light irradiation.

The photoresistors are preferably manufactured using thin-film technology, i.e. technologies that have already proven themselves in the manufacture of film or layered circuits. Thin film technology can also be used to manufacture the selection lines.

The controllable charging of the photoresistors with light can be achieved by masks located over them. Potentially controllable openings of these masks allow the light of a light source to pass through only at the desired locations. The imaging of the respective holes of a mask onto the selected photoresistors is also possible According to an especially preferred development of the invention, the photoresistors are chargeable with light via a deflectable beam. In view of the desired increase in conductivity, it is especially beneficial when the beam is formed by a focused laser beam.

According to a further, preferred development of the invention, an acousto-optical deflector is provided for deflecting the beam, which has the benefit of short positioning times.

For short positioning times of the deflectable beam, the photoresistors can then be serially charged with light. This is possible because the positioning time is short in comparison to the recombination time or decay time of the photoresistors. The controllable light charging can then be provided by a single laser, whereby a further, considerable reduction in the complexity of the apparatus results.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
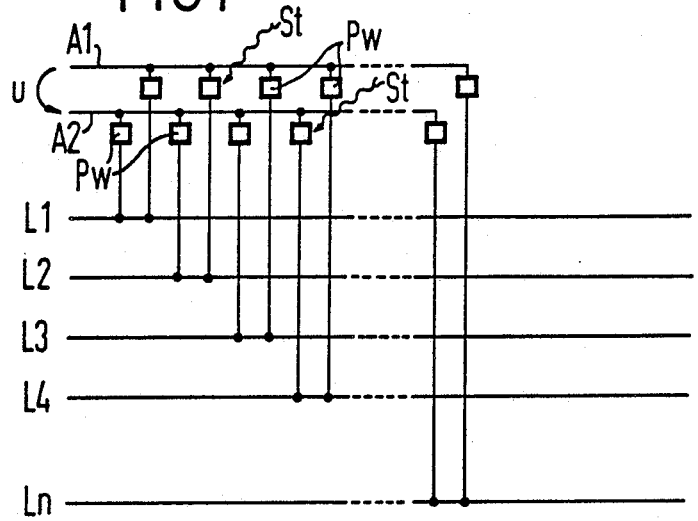
FIG. 1 is a diagram illustrating the fundamental principle of a device for selecting two of a plurality of lines.

In a greatly simplified, schematic view, FIG. 1 shows a device for selecting two of a plurality of lines L1, L2, L3, L4, etc., through Ln via two selection lines referenced A1 and A2. Each of the two selection lines A1 and A2 is connected to each of the lines L1 through Ln via a separate photoresistor Pw. When these photoresistors Pw are not illuminated they have a high electrical resistance and a voltage U applied to the selection lines A1 and A2 does not appear at the lines L1 through Ln. The lines L1 through Ln are selected by local light charging of the associated photoresistors Pw by means of a deflectable beam St and a focused laser beam. The selected photoresistors Pw then have a low electrical resistance, so that an adequate current can flow in the two allocated lines L1 through Ln. The charging of the photoresistors Pw associated with the selected lines L1 through Ln occurs serially via a singlebeam St of a single laser since the positioning time of an acousto-optical deflector used to deflect the beam St is low in comparison to the recombination time or decay time of the photoresistors Pw. The photoresistors Pw are composed of cadmium sulfide or cadmium selenide.

In the example shown in FIG. 1, the photoresistor Pw connected between the selection line A1 and the line L2 and the photoresistor Pw connected between the selection line A3 and the line L4 are successively charged with light by the deflectable beam St. In the illustrated case, the lines L2 and L4 are selected and are connected to the selection lines A1 and A2, respectively, in low-resistance fashion.

Figure 2:
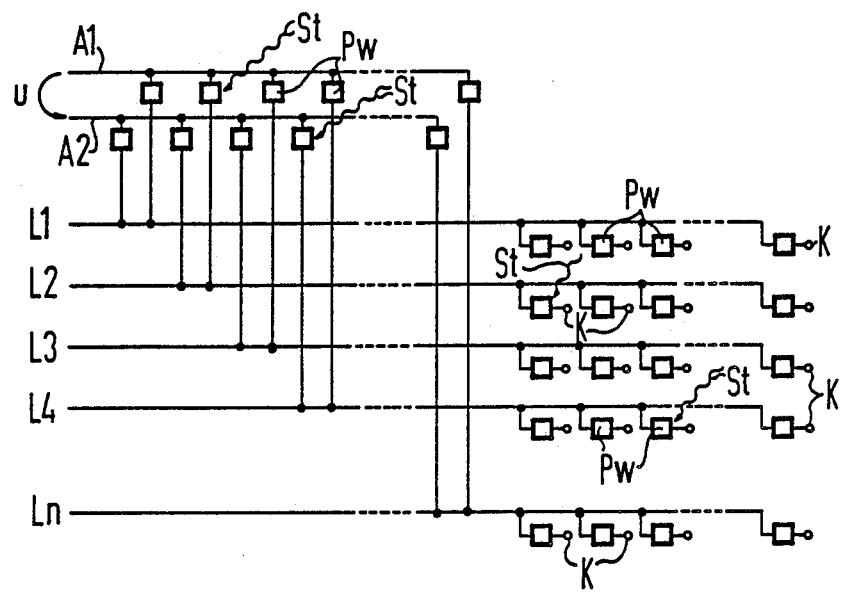
FIG. 2 is a diagram illustrating the fundamental principle of a device for selecting two of a plurality of contact locations arranged in a grid pattern.

FIG. 2 shows a greatly simplified, schematic view of a device for selecting two of a plurality of contact locations K arranged in a grid pattern, again via two selection lines referenced A1 and A2. These two selection lines A1 and A2, as in the device of FIG. 1, are connected to each of the lines L1 through Ln via a separate photoresistor Pw. Each of the lines L1 through Ln is allocated to a row of contact locations K arranged in a grid pattern, whereby each contact location K is connected to the allocated line L1 through Ln via a photoresistor Pw. The selection of the contact locations K occurs by local light charging of selected photoresistors Pw connected between the selection lines A1 and A3 and the lines A1 through Ln as well as of selected photoresistors Pw between the lines L1 through Ln and the selected contact locations K, this light charging being carried out with a deflectable beam St of a focused laser beam. The four resistors Pw charged with light then have a low resistance, so that each selection line A1, A2 is connected to one of the two selected contact locations K in a low-resistance fashion.

In the example shown in FIG. 2, a photoresistor Pw is connected between the selection line A1 and the line L2, a photoresistor Pw is connected between the selection line A2 and the line L4, a photoresistor Pw is connected to the line L2 in the first column, and a photoresistor Pw is connected to the line L4 in the third column These photoresistors are serially charged with light by the deflectable beam St, i.e. they are briefly charged in succession. In the illustrated case, the contact location K of the second row and of the first column and the contact location K of the fourth row and of the third column are selected and therefore, are connected to the selection lines A1 and A2, respectively in low-resistance fashion.

Figure 3:
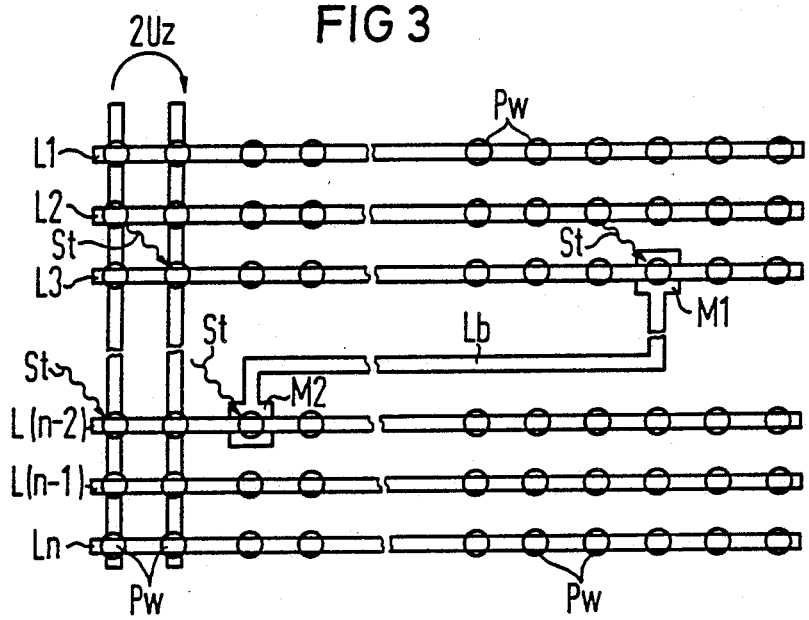
FIG. 3 is a diagram illustrating the utilization of a device according to FIG. 2 for the electrical function testing of printed circuit boards.

FIG. 3 shows the device fundamentally shown in FIG. 2 for the electrical function testing of printed circuit boards. The selection lines A1 and A2, the lines A1 and Ln as well as all photoresistors Pw are manufactured using thin-film technology. The photoresistors Pw at the intersections of the selection lines A1 and A2 and of the lines A1 through Ln may be seen as thin, circular layers that are located on the lines A1 through Ln and under the selection lines A1 and A2. All other photoresistors Pw are likewise fashioned as thin, circular layers that are located under the allocated lines L1 through Ln and are respectively connected to an electrode of a gas discharge channel. These gas discharge channels in the device disclosed by European Pat. application 0 102 565 for the electrical function testing of printed circuit boards provide ohmic contacting of the respective measuring locations. In the illustrated example, these are the measuring locations M1 and M2 of the interconnect Lb. Illustrated in FIG. 3 is the impingement of beam St on four selected photoresistors Pw. When the four selected photoresistors Pw serially chargeable with light via the beam St change to a low resistance state, then double the ignition voltage, 2Uz, is connected to the electrodes above the measuring locations M1 and M2. An ignition of the two gas discharge paths then results if the interconnect Lb is not interrupted.

Figure 4:
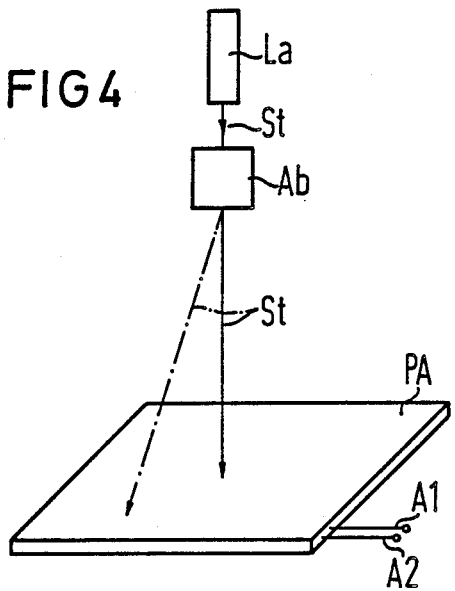
FIG. 4 is a perspective, overall view of the device disclosed in FIGS. 2 and 3.

FIG. 4 shows a perspective, overall view of the device disclosed in FIGS. 2 and 3. Shown is a planar adapter PA having, for example, $1000 \times 1000$ grid points, whereby every grid point has a photoresistor Pw of FIG. 2 allocated to it. The two selection lines A1 and A2 then have another 2000 photoresistors Pw allocated to them. A laser La such as, for example, a He-laser or a Ne-laser is situated above the planar adapter PA, the beam St of this laser La being capable of being directed onto each of the $10^6$ photoresistors Pw and the 2000 photoresistors Pw via an acousto-optical deflector Ab. The selection with $10^{12}$ connection possibilities thus only requires one deflectable beam St and the two selection lines A1 and A2.

In the device shown in simplified fashion in FIG. 3, the two measuring locations M1 and M2 could not be selected if both were allocated to a single line parallel to the lines L1 through Ln. For this reason, the lines L1 through Ln are positioned such that they proceed transversely relative to the principal directions of the printed circuit board to be tested. These principal directions are shown in FIG. 3 by the horizontal direction and by the vertical direction of the interconnect Lb. When, for example, the lines L1 through Ln proceed at an angle of 45° relative to the interconnects Lb, then all measuring locations can be reliably covered by turning the overall, planar adapter Pa (shown in FIG. 4) by an angle of 90° or 270° relative to the printed circuit board.

The devices of the invention are preferably utilized for the electrical function testing of wiring matrices wherein the measuring locations are ionically contacted, i.e. via gas discharge channels. The advantages of the selection devices, however, can also be employed in electrical function tests with conventional needle adapters and resilient test probes. Further possible uses of the selection devices of the invention are electrical function testing of card modules, the drive of displays such as, for example, gas discharge displays and the general selection of contacts arranged in a matrix configuration.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A device for selecting at least two of a plurality of lines L1, through Ln, comprising at least two selection lines connected to every line, L1 through Ln, via a photoresistor; and every photoresistor being controllably chargeable with light; and means for charging the photo resistors wherein said means for charging the photoresistors includes means for producing a deflectable beam, which causes a first selection line of said two selection lines to be connected via a respective photoresistor, that is charged by said means for charging, to one line of said plurality of lines, L1 through Ln, and a second selection line of said at least two selection lines to be connected via another respective photoresistor, that is charged by means for charging, to another different line of said plurality of lines, L1 through Ln.

2. The device according to claim 1, wherein the beam is formed by a focused laser beam.

3. The device according to claim 1, wherein an acousto-optical deflector is provided for deflecting the beam.

4. A device for selecting at least two of a plurality of contact locations arranged in a grid pattern, comprising the contact locations connected in rows to allocated lines, L1 through Ln, via a photoresistor; at least two selection lines A1, A2 connected to every line, L1 through Ln, via a photoresistor; and every photoresistor being controllably chargeable with light.

5. The device according to claim 4, wherein the photoresistors are composed of cadmium sulfide.

6. The device according to claim 4, wherein the photoresistors are manufactured using thin-film technology.

7. The device according to claim 4, wherein the selection lines are manufactured using thin-film technology.

8. The device according to claim 4, wherein the lines, L1 through Ln, are manufactured using thin-film technology.

9. The device according to claim 4, wherein the photoresistors are chargeable with light via a deflectable beam.

10. The device according to claim 9, wherein the beam is formed by a focused laser beam.

11. The device according to claim 9, wherein an acousto-optical deflector is provided for deflecting the beam.

12. The device according to claim 9, wherein the photoresistors are serially chargeable with light.

13. The device according to claim 4, wherein the photoresistors are composed of cadmium selenide.

* * * * *